United States Patent [19]
Dobkin

[11] 4,207,481
[45] Jun. 10, 1980

[54] POWER IC PROTECTION BY SENSING AND LIMITING THERMAL GRADIENTS

[75] Inventor: Robert C. Dobkin, Hillsborough, Calif.

[73] Assignee: National Semiconductor Corporation, Santa Clara, Calif.

[21] Appl. No.: 846,053

[22] Filed: Oct. 27, 1977

[51] Int. Cl.² .................. H03K 3/26; G01K 7/00
[52] U.S. Cl. .................. 307/310; 307/303; 357/28
[58] Field of Search .......... 307/310, 304, 303; 357/28, 81

[56] References Cited

U.S. PATENT DOCUMENTS

| | | | |
|---|---|---|---|
| 3,199,001 | 8/1965 | Dyben | 357/28 |
| 3,393,870 | 5/1968 | Jeffrey | 357/28 |
| 3,715,288 | 2/1973 | Risqin | 357/28 |
| 4,071,813 | 1/1978 | Dobkin | 307/310 |

FOREIGN PATENT DOCUMENTS 1081486  8/1967  United Kingdom ............ 357/28

Primary Examiner—Stanley D. Miller, Jr.
Assistant Examiner—B. P. Davis
Attorney, Agent, or Firm—Gail W. Woodward; James A. Sheridan

[57] ABSTRACT

In an IC having a power dissipating element, an integral thermocouple is located so as to respond to the thermal gradient in the IC chip that results from such power dissipation. Control circuitry, also on chip, responds to the thermocouple output and acts to limit dissipation to produce a predetermined maximum thermal gradient.

4 Claims, 6 Drawing Figures

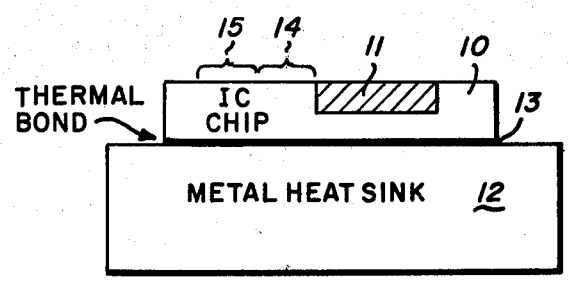
Fig_1
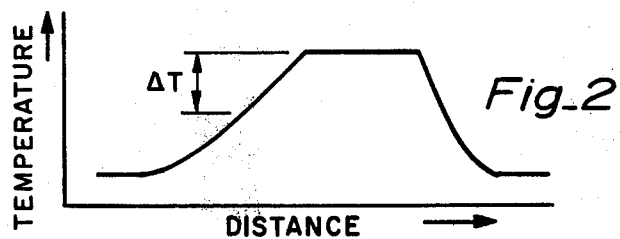
Fig_2
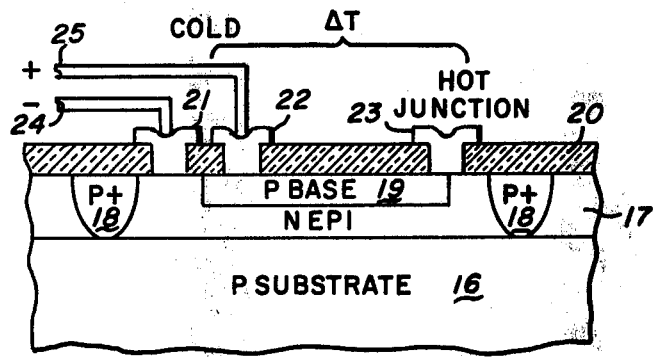
Fig_3
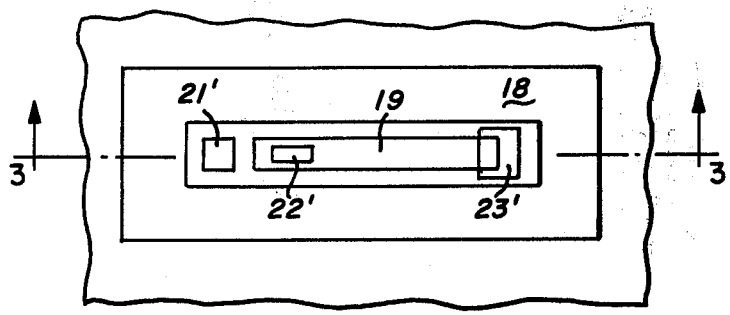
Fig_4

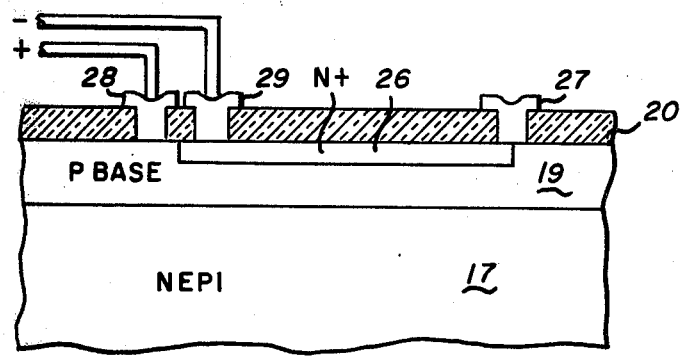
Fig_5
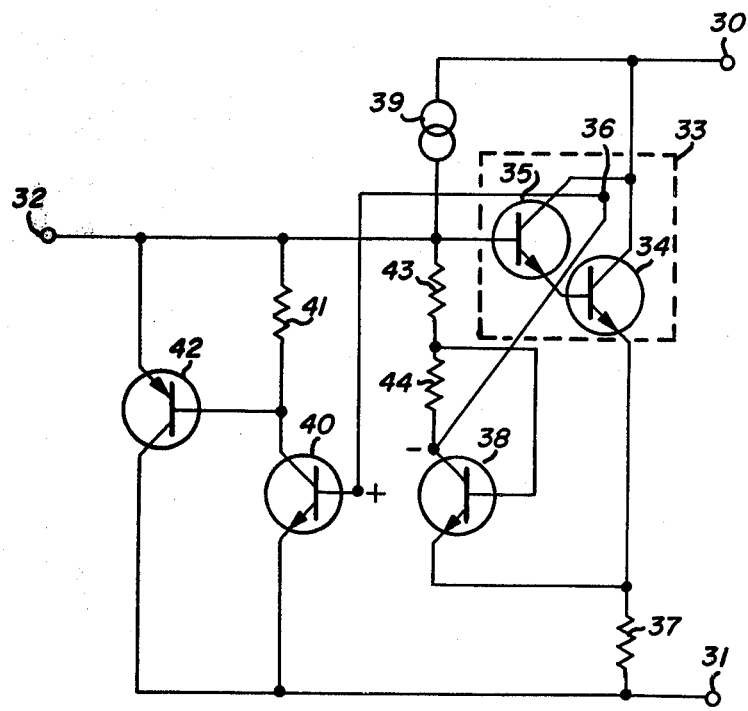
Fig_6

POWER IC PROTECTION BY SENSING AND LIMITING THERMAL GRADIENTS

BACKGROUND OF THE INVENTION

As integrated circuit (IC) design progresses, it becomes a useful expedient to integrate devices having substantial power dissipation into IC chip structures. The chip is ordinarily mounted on a heat sink structure that acts to remove the heat from the chip to prevent excessive temperature rise. If more power is dissipated than can be removed by the heat sink, the device temperature will rise. Such a rise, if not controlled, can reach a destructive level. If the input energy available is sufficiently limited and the heat sink adequate, dissipation will not cause excessive temperature rise. However, simply limiting the input energy makes it very difficult to take advantage of the useful device characteristics. For example, in a low current system high voltages can be employed with voltage break-down setting the operating limit. In a low voltage system high currents can be employed. Typically, a chart is provided for a given device to display voltage and current values. An operating line is drawn on the chart to denote the maximum power contour. The circuit designer then makes such that the maximum power contour is not exceeded. If necessary, the designer can employ limiting circuitry to ensure compliance with the power limits.

As the maximum power contour is approached, danger of exceeding it increases and conservative design means that the device characteristics cannot be fully exploited. As the maximum power contour is approached, the designer typically employs more complex limiting circuitry. It would be desirable to employ internal circuitry in IC form to provide the operating condition limits.

SUMMARY OF THE INVENTION

It is an object of the invention to control the dissipation in a power device in an IC chip by sensing the thermal gradient and limiting dissipation as a function of the gradient.

It is a further object of the invention to integrate sensing and control elements into an IC chip that has a power dissipating element whereby dissipation is controlled as a function of a thermal gradient.

These and other objects are achieved on a portion of an IC chip. One portion of the chip contains an element designed to dissipate substantial power. An integrated thermocouple, having its hot junction located near the power dissipating element, will respond as a function of the thermal gradient. A control amplifier section responds to the thermocouple and acts to limit dissipation in the power device.

Since the thermocouple hot junction can be located close to the region of power dissipation, it will respond very rapidly to changes in the thermal gradients present. This will provide precise and extremely rapid control and will thus afford excellent transient protection.

BRIEF DESCRIPTION OF THE DRAWINGS

FIG. 1 is a general showing of a cross section of a power IC device in accordance with the invention;

FIG. 2 is a graph showing a temperature profile of the device of FIG. 1;

FIG. 3 is a cross section of a portion of an IC showing one form of thermocouple construction;

FIG. 4 is a fragmentary view of the topography of the device of FIG. 3;

FIG. 5 is a cross section of a portion of an IC showing an alternative form of thermocouple construction; and FIG. 6 is a schematic diagram of a portion of an IC showing a power dissipating element, thermocouple, and control amplifier.

DESCRIPTION OF THE INVENTION

In FIG. 1 the elements of a power IC are shown. The IC chip 10, containing a power device in a heat generating region 11, is mounted on a metal heat sink 12 by bonding material 13. For example, while other forms of construction are clearly possible, heat sink 12 could be the mounting face portion of the industry standard TO-3 housing. A silicon IC chip 10 is soldered or otherwise bonded thereto at 13 so as to produce a highly thermally conductive structure.

FIG. 2 shows a temperature profile for a structure such as the one in FIG. 1. As can be seen, the heat generating region 11 produces the highest temperature. For convenience the temperature is shown as constant over region 11 but there could be variations due to fine structure. The profile would be taken at the top of the structure and the lower portion would be located at the heat sink temperature at regions outside of the chip. Two gradients are shown. They are different because region 11 is located asymmetrically in chip 10. A thermocouple region is shown at 14 adjacent to region 11. With the structure shown the thermocouple will respond to $\Delta T$ as shown in FIG. 2. Clearly the magnitude of $\Delta T$ will be closely associated with the magnitude of power dissipation. The thermocouple hot junction will be associated with the upper gradient portion while the cold junction will be located as far as possible down the gradient.

A control circuit is shown at 15 away from the hot region. While not shown, the IC would contain metallization that would interconnect the various devices. Also other IC chip circuitry (not shown) can be incorporated elsewhere in the chip 10. While the thermocouple is shown as located between regions 13 and 15, it could, if desired, be located on the other side of region 11 where the steeper gradient is shown in FIG. 2. In this case the metallization would be run around region 11 to interconnect with the control circuitry at 15. The important consideration is to locate the thermocouple along a gradient produced by dissipation in the power device. This provides good sensitivity to dissipation and makes the device sensitive to rapid changes in dissipation.

FIG. 3 shows one form of thermocouple construction in an IC. A conventional IC p type substrate is shown at 16. The substrate is overcoated with an n type epitaxial layer 17 which is isolated into tubs by p type isolation rings one of which is shown at 18 extending completely through layer 17. A p type strip is diffused in accordance with conventional transistor base type diffusion at 19. Holes are etched conventionally through the planar passivating oxide 20 and metal contacts established at 21–23. Typically the structure of FIG. 3 is elongated as shown in FIG. 4, which is a fragmentary top view of FIG. 3. Here the metallization is omitted for clarity. The diffusion 19 is a strip inside the epitaxial tub isolated by region 18. In practice region 19 can be made as long as desired to span the required T in the gradient shown in FIG. 2. The oxide cuts nder contacts 21–23 are shown as 21'–23'. The cut at 23' spans the p n junction and constitutes the thermocouple hot junction. 21' exposes only n type material and 22' exposes only p type material so that metal contacts 21 and 22 constitute the − and + terminals of the cold junction of the thermocouple. The potential generated will be a function of ΔT and the materials involved. In the preferred embodiment the semiconductor is silicon and the metal aluminum. The combination shown in FIG. 3 will typically produce about 6 to 8 millivolts per degree C. As an alternative to the construction of FIG. 3, the thermocouple can be metal to semiconductor on either the n type epitaxial layer 17 or on the p type diffused layer 19. For the metal to base-diffused material a sensitivity of about 2 millivolts per degree C is typical.

Ordinarily the metal contacts 21 and 22 will be extended over the oxide 20 surface to make connection to other IC element on the chip (not shown). These interconnections are designated by wires 24 and 25 as a schematic representation.

FIG. 5 shows another construction alternative. Here the thermocouple is associated with an emitter diffusion 26. The construction is similar to that of FIG. 3 except that the thermocouple is confined to the p type base layer. Hot junction contact 27 shorts emitter diffusion 26 to base diffusion 19. Cold junction contacts 28 and 29 make contact to the base diffusion 19 and emitter diffusion 26 respectively,. The structure of FIG. 5 typically produces an output of about 2.2 millivolts per degree C. In addition, either the emitter diffused silicon or the base diffused silicon can be used alone in a semiconductor to metal thermocouple structure as described above. In this case the emitter thermocouple would yield a response of about 0.2 millivolt per degree C and the base thermocouple a response of about 2 millivolts per degree C.

The above response values are approximate and will vary with the surface dopant concentration. The numbers given are obtained with material conventionally processed to produce linear IC devices. While only a single thermocouple is shown, if a greater response is desired, a number of such structures can be fabricated side by side and the IC metallization used to connect the individual thermocouples in series.

FIG. 6 is a schematic diagram of an IC employing the invention. In practice the circuit shown will typically be a portion of a larger IC device. The circuit includes a power device 33 along with the control circuitry. The remainder of the IC elements (not shown) have no direct relation to the invention. The circuit performs as a single power transistor with terminal 30 acting as the base. This three terminal device will operate as a high power, high gain, amplifier stage.

Transistor 34 is a large area device driven by a smaller area transistor 35 in the conventional Darlington configuration. Typically, transistor 34 wil be a number of separate high performance power transistors connected in parallel. Such an arrangement produces a composite transistor of high power capability and high Beta or current gain. For example, using an IC mounted on a TO-3 metal base, which is properly attached to a heat sink, device 33 can be made to dissipate about 200 watts. The composite transistor can have a typical Beta of about 5000.

Thermocouple 36 is associated in thermal proximity to device 33 as described above. The remainder of the circuitry shown (and other chip circuitry not shown) is located elsewhere on the IC chip relatively remote from device 33.

A small value resistor 37 is connected into the emitter circuit of device 33 so as to develop a small potential when operating circuit flows. The potential at the emitter of transistor 38 is typically on the order of about 0.12 volt. The actual value of resistor 37 will be a function of the current capability of transistor 34. The control section is operated by way of current source 39 which is coupled between terminals 30 and 32 and typically operates at about a milliampere.

Thermocouple 36 has its terminals connected between the collector of transistor 38 and the base of transistor 40 and is poled so that as temperature rises transistor 40 becomes more conductive. Resistor 41 acts a load for transistor 40 to directly drive transistor 42 which acts to control the potential between terminals 31 and 32. Resistors 43 and 44 act as the load and biasing elements for transistor 38.

Assuming that a potential is applied between terminals 31 and 32. Resistors 43 and 44 act as the load and biasing elements for transistor 38.

Assuming that a potential is applied between terminals 31 and 30, as will be the case in normal operations, a stabilized potential to be described below will develop across resistor 37. If the potential were to tend to increase, conduction in transistor 38 would decrease and its collector potential would rise. This would raise the base potential at transistor 40, thereby increasing its conduction, and this would pull the base of transistor 42 toward the potential of terminal 31. This would increase the conduction in transistor 42 which would pull terminal 32 toward the potential at terminal 31. This in turn would reduce conduction in device 33 and tend to lower the potential across resistor 37, thus offsetting the postulated rise. If the potential across resistor 37 were to tend to fall, the reverse of the above sequence would develop an increased conduction in device 33 would offset the postulated drop. In effect high gain feedback exists around the above-described loop. Since the feedback is negative, it acts to stabilize the voltage developed across resistor 37.

The actual voltage developed across resistor 37 will be in accordance with the following formula:

$$V_{37} = \frac{KT}{q} \ln\left(\frac{I40}{I40} \cdot \frac{A38}{I38}\right) + \quad (1)$$
$$(V_{BE33} - V_{BE40}) \frac{R44}{R43 + R44} - V_{36}$$

where:
V37 is the voltage across resistor 37
K is Boltzman's constant
T is absolute temperature
q is the electron charge
I40 is the current in transistor 40
I38 is the current in transistor 38
A40 is the area of transistor 40
A38 is the area of transistor 38
$V_{BE33}$ is the base to emitter voltage of device 33
$V_{BE40}$ is the base to emitter voltage of transistor 40
R44/(R43+R44) is the voltage division ratio of resistors 44 and 43.
V36 is the voltage across thermocouple 36.
In the above formula it can be seen that the first bracketed term is actually the current density ratio of transistor 40 to that of transistor 38. If resistor 41 is made equal to the sum of resistors 43 plus 44, it can be seen that the currents in transistors 38 and 41 will be equal. For this condition the current density ratio reduces to A38/A40. A convenient area ratio of ten yields a first term potential of about 60 millivolts at 300° Kelvin. This potential, being proportional to T, has a positive temperature coefficient.

The second term in the equation has, as a dominant quantity, the base to emitter voltage of device 33 less the base to emitter voltage of transistor 40. This leaves a single junction voltage which has a negative temperature coefficient. If the voltage division ratio of resistors 44 to 43 is also made equal to 1/10, to match the current density ratio for the first term, the two temperature variable terms will cancel, thus making the system insensitive to ambient temperature. The last equation term, V36, shows that the potential across resistor 37 is only varied by the thermocouple voltage and is negatively related thereto. This shows that any increase in temperature gradient is met with a decrease in current through device 33, thus reducing its dissipation in proportion to the gradient.

From formula (1) it is clear that for a silicon IC using current density and resistor voltage division ratios of ten, the voltage across resistor 37 will be on the order of 120 millivolts at 300° K. If device 33 is to operate at 10 amperes, resistor 37 would be about 12 milliohms.

As a gradient develops due to dissipation and thermocouple 36 develops a potential, transistor 40 will conduct more heavily and drive transistor 42 into greater conduction. This will pull the potential at terminal 32 toward the potential at terminal 31, thus reducing the current flowing in device 33 and the resulting dissipation. Therefore in response to a temperature gradient increase produced by dissipation, the circuit acts to limit the power applied to device 33. Since the hot junction of thermocouple 36 can be closely associated with the collector of transistor 34, the thermally produced potential will react very quickly and the circuit will rapidly reduce the dissipation. Such a circuit configuration can be made to respond much more rapidly than the conventional protective fuse. In fact, thermal transients, that would ordinarily result in destruction of transistor 34, can be reacted to and prevented from producing destructive current values.

The invention has been described and a preferred embodiment has been detailed. Clearly there are alternatives and equivalents that will occur to a person skilled in the art. For example, while the output devices are shown as NPN transistors, all of the conductivity types could be made complementary in which case the applied potentials would be of the opposite polarity. Also the circuit of the invention could be used twice in complementary fashion to create a complementary system pair. Accordingly it is intended that the scope of the invention be limited only by the claims that follow.

I claim:

1. A circuit for incorporation into a monolithic integrated circuit structure, said structure including an integrated circuit chip mounted in heat exchange relation with an associated mounting, said circuit comprising:

power dissipating circuit element means;

thermocouple means having a hot junction associated in thermal proximity to said power dissipating means and a cold junction located in lesser thermal proximity to said power dissipating means with said cold junction being connected to a pair of circuit terminals whereby said thermocouple means produces a potential difference between said terminals that is a function of the thermal gradient between said hot and cold functions;

control circuit means coupled to said thermocouple terminals to be responsive to said potential difference and coupled to said power dissipating means to control the power dissipated therein whereby said power dissipated is limited in response to the output of said thermocouple means.

2. The circuit of claim 1 wherein said control circuit comprises:

output control means coupled to said power dissipating means to limit the power dissipation therein;

amplifier means having an input coupled to said thermocouple and an output coupled to said output control means.

3. The circuit of claim 2 wherein said power dissipating means develops a potential having a negative temperature coefficient and said amplifier means comprises:

a pair of transistors;

means for operating said transistors at different current densities to generate a potential having a positive temperature coefficient;

means for combining said positive coefficient potential, said negative coefficient potential and said thermocouple potential whereby said control circuit produces a control potential related only to said thermocouple response.

4. The circuit of claim 3 wherein said transistors are operated at the same current values and have different area emitters.

* * * * *